(12) United States Patent
Lee et al.

(10) Patent No.: US 12,713,642 B2
(45) Date of Patent: Aug. 18, 2026

(54) SEMICONDUCTOR MEMORY DEVICE

(71) Applicant: Samsung Electronics Co., Ltd., Suwon-si (KR)

(72) Inventors: Wonsok Lee, Suwon-si (KR); Min Tae Ryu, Hwaseong-si (KR); Sungwon Yoo, Hwaseong-si (KR); Kiseok Lee, Hwaseong-si (KR); Min Hee Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 576 days.

(21) Appl. No.: 17/976,955

(22) Filed: Oct. 31, 2022

(65) Prior Publication Data

US 2023/0187548 A1 Jun. 15, 2023

(30) Foreign Application Priority Data

Dec. 15, 2021 (KR) ........................ 10-2021-0180064

(51) Int. Cl.

*H10D 30/63* (2025.01)
*G11C 5/06* (2006.01)
*H10B 99/00* (2023.01)
*H10D 62/13* (2025.01)
*H10D 62/17* (2025.01)

(52) U.S. Cl.

CPC ............. *H10D 30/63* (2025.01); *G11C 5/063* (2013.01); *H10B 99/00* (2023.02); *H10D 62/151* (2025.01); *H10D 62/235* (2025.01)

(58) Field of Classification Search

CPC .............................. H10B 12/482; H10D 30/63
See application file for complete search history.

(56) References Cited

U.S. PATENT DOCUMENTS

| | | | | |
|---|---|---|---|---|
| 8,643,096 | B2 | 2/2014 | Hwang | |
| 10,290,537 | B2 | 5/2019 | Lee et al. | |
| 11,062,965 | B2 | 7/2021 | Cheng et al. | |
| 11,062,989 | B2 | 7/2021 | Sukekawa | |
| 11,282,843 | B2 | 3/2022 | Ye et al. | |
| 2013/0234342 | A1* | 9/2013 | Shibata | H10W 20/20 257/774 |
| 2019/0096775 | A1* | 3/2019 | Cheng | H10D 30/63 |
| 2020/0111800 | A1 | 4/2020 | Ramaswamy | |

(Continued)

FOREIGN PATENT DOCUMENTS

| | | | |
|---|---|---|---|
| KR | 1020130103908 | A | 9/2013 |
| KR | 1020150134995 | A | 12/2015 |

(Continued)

*Primary Examiner* — Ali Naraghi
(74) *Attorney, Agent, or Firm* — Muir Patent Law, PLLC

(57) ABSTRACT

A semiconductor memory device includes bit lines disposed on a substrate and extending in a first direction in parallel to each other, a hydrogen supply insulating layer including hydrogen and filling a space between the bit lines, a source pattern located on each of the bit lines and being in partial contact with the hydrogen supply insulating layer, a hydrogen diffusion barrier layer covering a top surface of the hydrogen supply insulating layer and being in contact with a side surface of the source pattern, a first channel pattern located on the source pattern, a first word line being adjacent to a side surface of the first channel pattern and crossing over the bit lines, and a landing pad on the first channel pattern.

18 Claims, 23 Drawing Sheets

(56) References Cited

U.S. PATENT DOCUMENTS

| | | | | |
|---|---|---|---|---|
| 2020/0350315 | A1* | 11/2020 | Son | H10B 12/05 |
| 2021/0351140 | A1* | 11/2021 | Tsai | H10W 20/072 |
| 2021/0375877 | A1 | 12/2021 | Kim et al. | |

FOREIGN PATENT DOCUMENTS

| | | | |
|---|---|---|---|
| TW | I710121 | B | 11/2020 |
| TW | 202145440 | A | 12/2021 |

* cited by examiner 155
151
WL2
Gox2
HB
HC
110
100
C'
C
BL SP
AP2 BL
G1
BL
P2 HB
BL
B'
B
153
Gox1
WL1
HB
HC
110
100
A'
A
DSP
LP
AP1
115
BL
P1
SP 133
131
HB
HC
110
100
C'
SP
BL
AP
G1
C
B'
115
HC
B
A'
A

SEMICONDUCTOR MEMORY DEVICE

CROSS-REFERENCE TO RELATED APPLICATION(S)

This U.S. non-provisional patent application claims priority under 35 U.S.C. § 119 to Korean Patent Application No. 10-2021-0180064, filed on Dec. 15, 2021, in the Korean Intellectual Property Office, the disclosure of which is hereby incorporated in its entirety by reference.

BACKGROUND OF THE INVENTION

The present disclosure relates to a semiconductor memory device, and more particularly, to a semiconductor memory device including vertical channel transistors and a method of manufacturing the same.

As design rules of semiconductor devices have been reduced, manufacturing techniques have been developed to improve integration densities, operating speeds and yields of semiconductor devices. Thus, transistors having vertical channels have been suggested to improve integration densities, resistances and current driving ability of transistors.

SUMMARY

Embodiments of the inventive concepts may provide a semiconductor memory device with improved electrical characteristics and integration density.

According to example embodiments, a semiconductor memory device may include bit lines disposed on a substrate and extending in a first direction in parallel to each other; a hydrogen supply insulating layer including hydrogen and filling a space between the bit lines; a source pattern located on each of the bit lines and being in partial contact with the hydrogen supply insulating layer; a hydrogen diffusion barrier layer covering a top surface of the hydrogen supply insulating layer and being in contact with a side surface of the source pattern; a first channel pattern located on the source pattern, a first word line being adjacent to a side surface of the first channel pattern and crossing over the bit lines; and a landing pad on the first channel pattern.

According to example embodiments, a semiconductor memory device may include a first bit line disposed on a substrate, the first bit line having a first side surface and a second side surface which are opposite to each other; a source pattern being in contact with at least one of the first side surface or the second side surface of the first bit line and being in contact with a top surface of the first bit line; a first channel pattern located on the source pattern; a first word line being adjacent to a side surface of the first channel pattern and crossing over the first bit line; and a landing pad on the first channel pattern.

According to example embodiments, a semiconductor memory device may include bit lines disposed on a substrate and extending in a first direction in parallel to each other; an interlayer insulating layer between the bit lines; a source pattern located on each of the bit lines; a first channel pattern and a second channel pattern which are located on the source pattern and are spaced apart from each other; a first word line and a second word line which are located between the first channel pattern and the second channel pattern and are spaced apart from each other, the first word line adjacent to the first channel pattern, the second word line adjacent to the second channel pattern, and the first and second word lines crossing over the bit lines; a first gate insulating layer disposed between the first channel pattern and the first word line and between the source pattern and the first word line; a second gate insulating layer disposed between the second channel pattern and the second word line and between the source pattern and the second word line; and landing pads disposed on the first channel pattern and the second channel pattern, respectively. A concentration of hydrogen in the source pattern may be higher than a concentration of hydrogen in each of the first and second channel patterns.

BRIEF DESCRIPTION OF THE DRAWINGS

FIGS. 7A to 9A are plan views illustrating a method of manufacturing the semiconductor memory device of FIG. 3 according to example embodiments.

FIGS. 7B to 9B are cross-sectional views taken along lines A-A', B-B' and C-C' of FIGS. 7A to 9A, respectively, to illustrate a method of manufacturing the semiconductor memory device of FIG. 4 according to example embodiments.

DETAILED DESCRIPTION

Example embodiments of the inventive concepts will now be described more fully with reference to the accompanying drawings.

Figure 1:
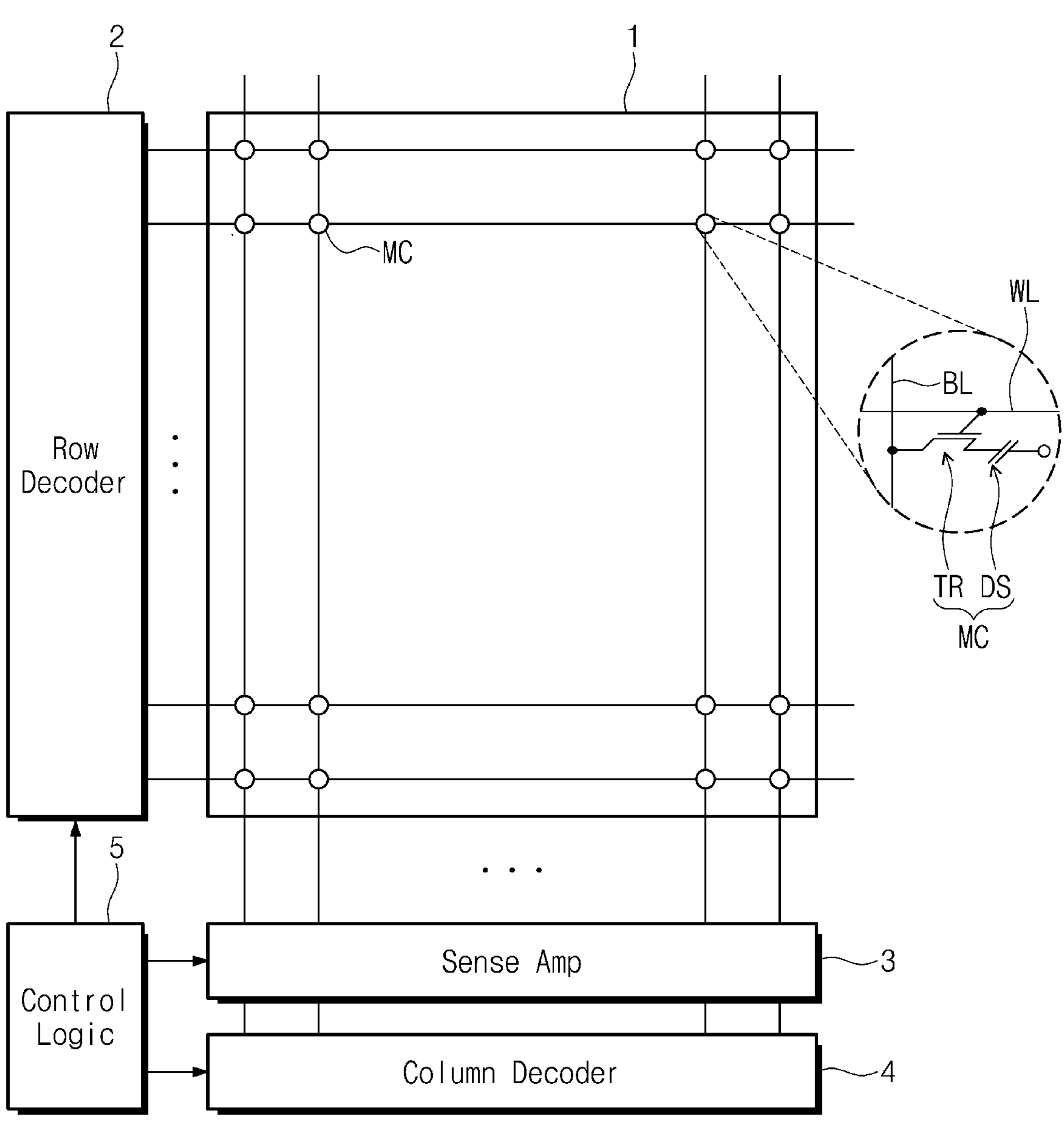
FIG. 1 is a block diagram illustrating a semiconductor memory device according to some embodiments of the inventive concepts.

FIG. 1 is a block diagram illustrating a semiconductor memory device according to some embodiments of the inventive concepts.

Referring to FIG. 1, a semiconductor memory device may include a memory cell array 1, a row decoder 2, a sense amplifier 3, a column decoder 4, and a control logic 5.

The memory cell array 1 may include a plurality of memory cells MC two-dimensionally or three-dimensionally arranged. Each of the memory cells MC may be connected between a word line WL and a bit line BL which intersect each other.

Each of the memory cells MC may include a selection element TR and a data storage element DS, and the selection element TR and the data storage element DS may be electrically connected in series to each other. The selection element TR may be connected between the data storage element DS and the word line WL, and the data storage element DS may be connected to the bit line BL through the selection element TR. The selection element TR may be a field effect transistor (FET), and the data storage element DS may be realized as a capacitor, a magnetic tunnel junction pattern, or a variable resistor. For example, the selection element TR may include a transistor, a gate electrode of the transistor may be connected to the word line WL, and drain/source terminals of the transistor may be connected to the bit line BL and the data storage element DS, respectively.

The row decoder 2 may decode an address signal input from the outside to select one among the word lines WL of the memory cell array 1. Herein, for convenience of description, the terms of the word lines WL and the word line WL may be used interchangeably. The address signal decoded in the row decoder 2 may be provided to a row driver (not shown), and the row driver may respectively provide predetermined voltages to a selected word line WL and unselected word lines WL in response to control signals of control circuits.

The sense amplifier 3 may sense and amplify a voltage difference between a reference bit line and a bit line BL selected by an address signal decoded from the column decoder 4 and may output the amplified voltage difference.

The column decoder 4 may provide a data transmission path between the sense amplifier 3 and an external device (e.g., a memory controller). The column decoder 4 may decode an address signal input from the outside to select one among the bit lines BL. Herein, for convenience of description, the terms of the bit lines BL and the bit line BL may be used interchangeably The control logic 5 may generate control signals for controlling operations of writing/reading data into/from the memory cell array 1.

Figure 2:
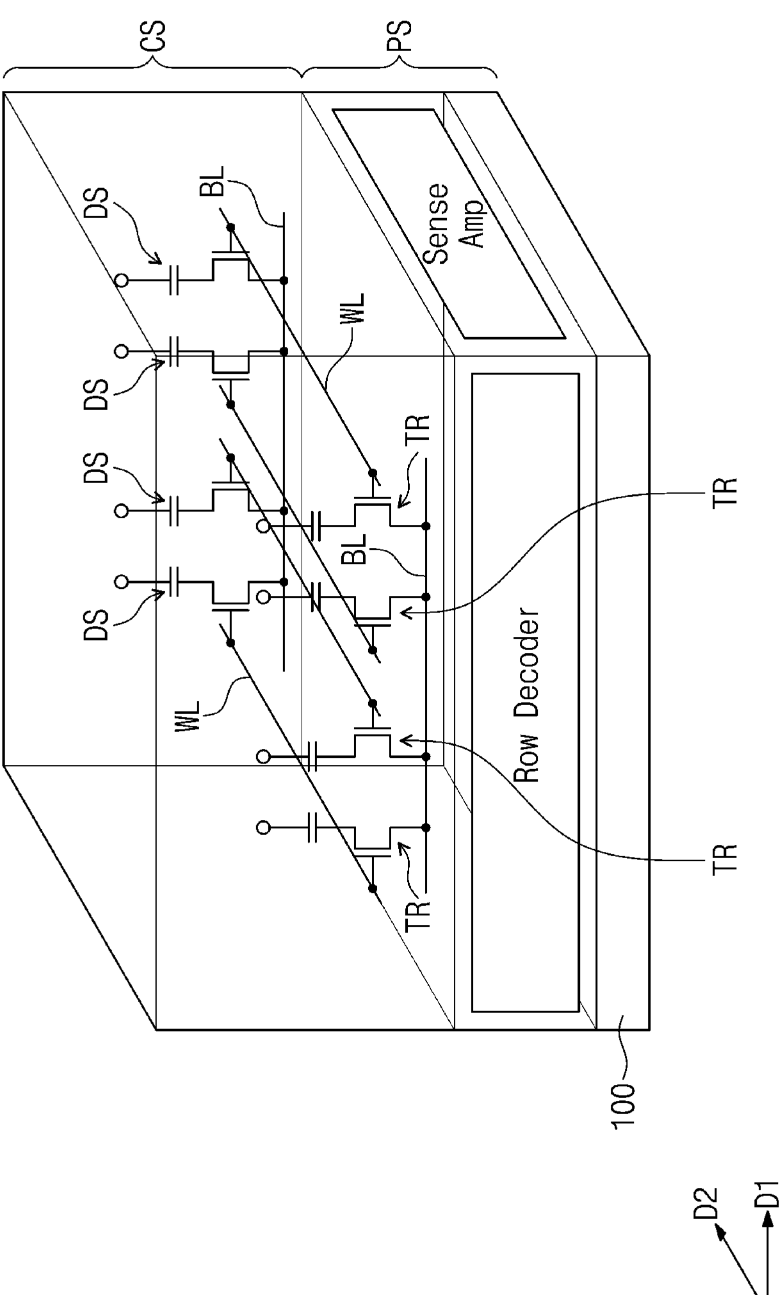
FIG. 2 is a perspective view schematically illustrating a semiconductor memory device according to some embodiments of the inventive concepts.

FIG. 2 is a perspective view schematically illustrating a semiconductor memory device according to some embodiments of the inventive concepts.

Referring to FIG. 2, a semiconductor memory device may include a peripheral circuit structure PS on a semiconductor substrate 100, and a cell array structure CS on the peripheral circuit structure PS.

The peripheral circuit structure PS may include core and peripheral circuits formed on the semiconductor substrate 100. The core and peripheral circuits may include the row and column decoders 2 and 4 (see FIG. 1), the sense amplifier 3 (see FIG. 1) and the control logic 5 (see FIG. 1), described with reference to FIG. 1. The peripheral circuit structure PS may be provided between the semiconductor substrate 100 and the cell array structure CS in a third direction D3 perpendicular to a top surface of the semiconductor substrate 100.

The cell array structure CS may include bit lines BL, word lines WL, and memory cells MC (see FIG. 1) between the bit lines BL and the word lines WL. The memory cells MC (see FIG. 1) may be two-dimensionally or three-dimensionally arranged on a plane extending in first and second directions D1 and D2 crossing over each other. As described above, each of the memory cells MC (see FIG. 1) may include a selection element TR and a data storage element DS.

In some embodiments, the selection element TR of each of the memory cells MC (see FIG. 1) may include a vertical channel transistor (VCT). The vertical channel transistor may mean a transistor having a structure in which a channel length extends in a direction (i.e., the third direction D3) perpendicular to the top surface of the semiconductor substrate 100. In addition, a capacitor may be provided as the data storage element DS of each of the memory cells MC (see FIG. 1).

Figure 3:
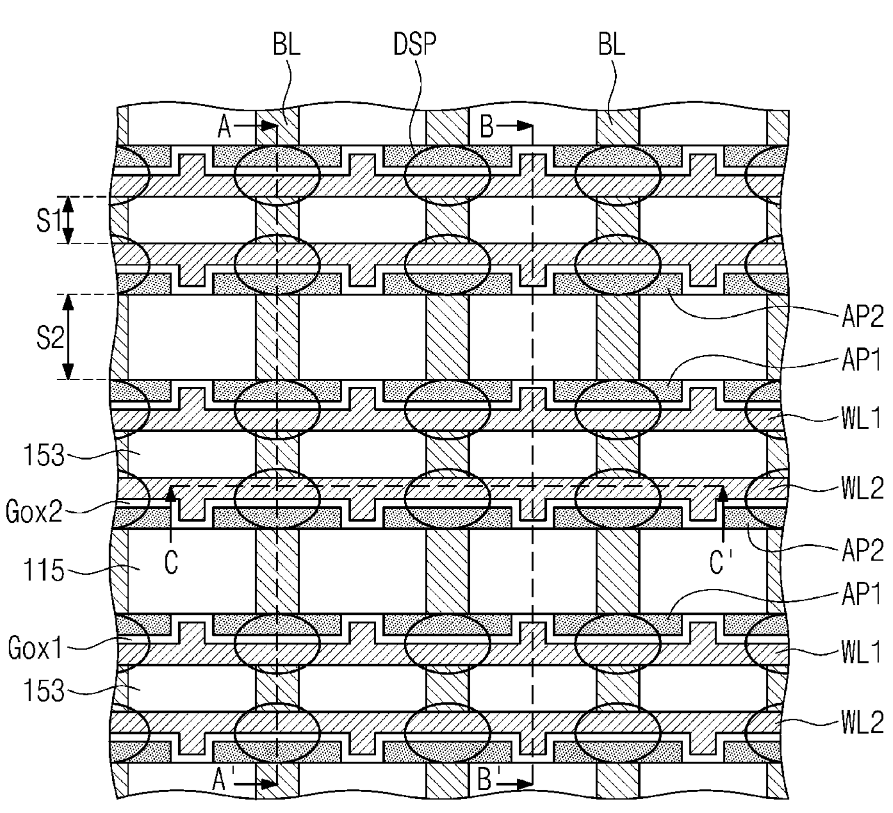
FIG. 3 is a plan view illustrating a semiconductor memory device according to some embodiments of the inventive concepts.
Figure 3:
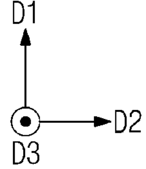
Figure 4:
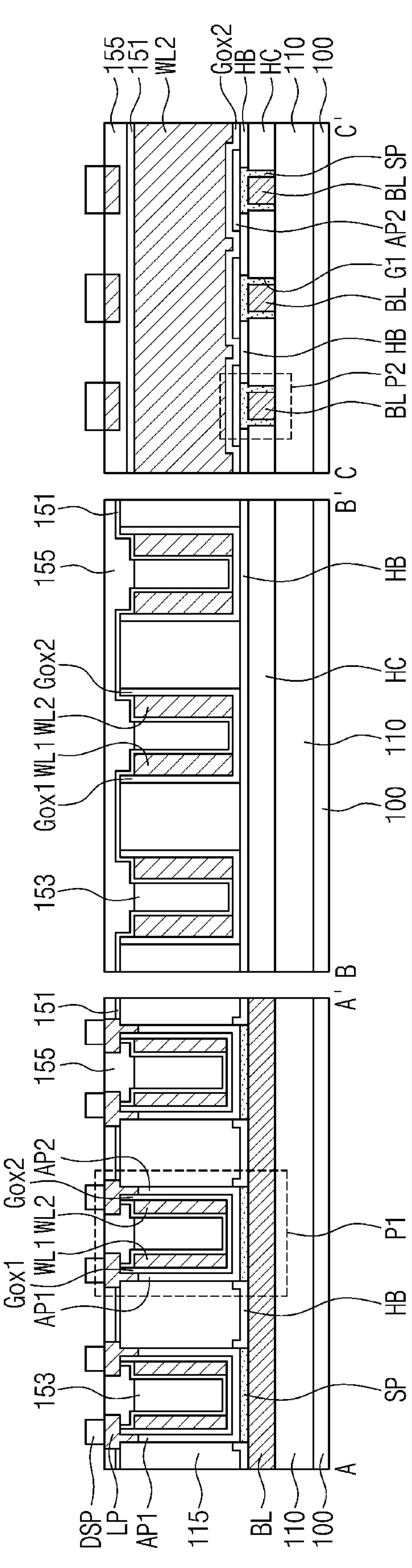
FIG. 4 is a cross-sectional view taken along lines A-A', B-B' and C-C' of FIG. 3 to illustrate a semiconductor memory device according to some embodiments of the inventive concepts.
Figure 5A:
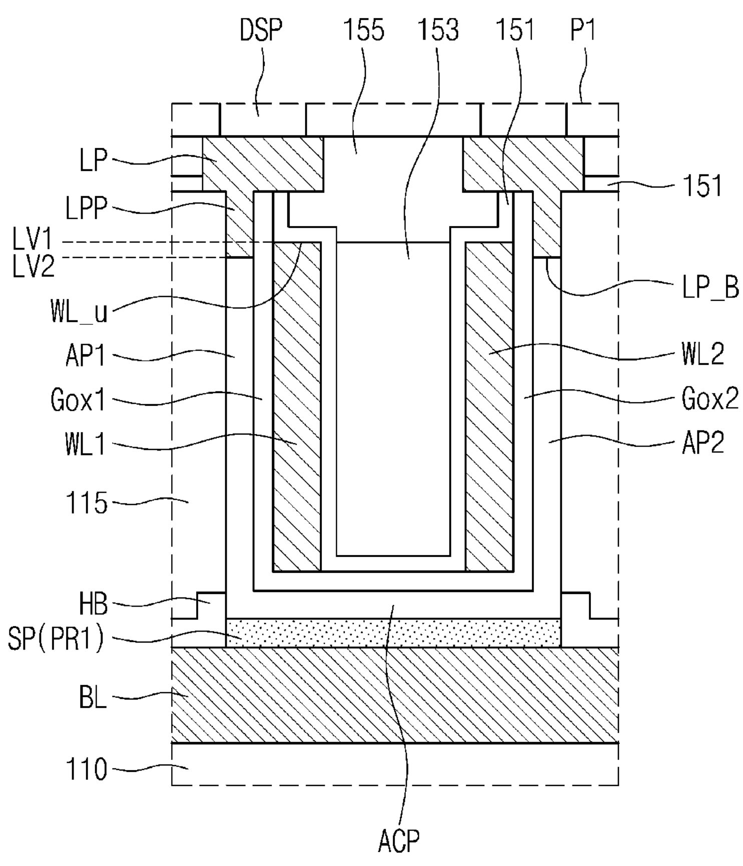
FIGS. 5A and 5B are enlarged views of a portion 'P1' of FIG. 4 according to some embodiments of the inventive concepts.
Figure 5B:
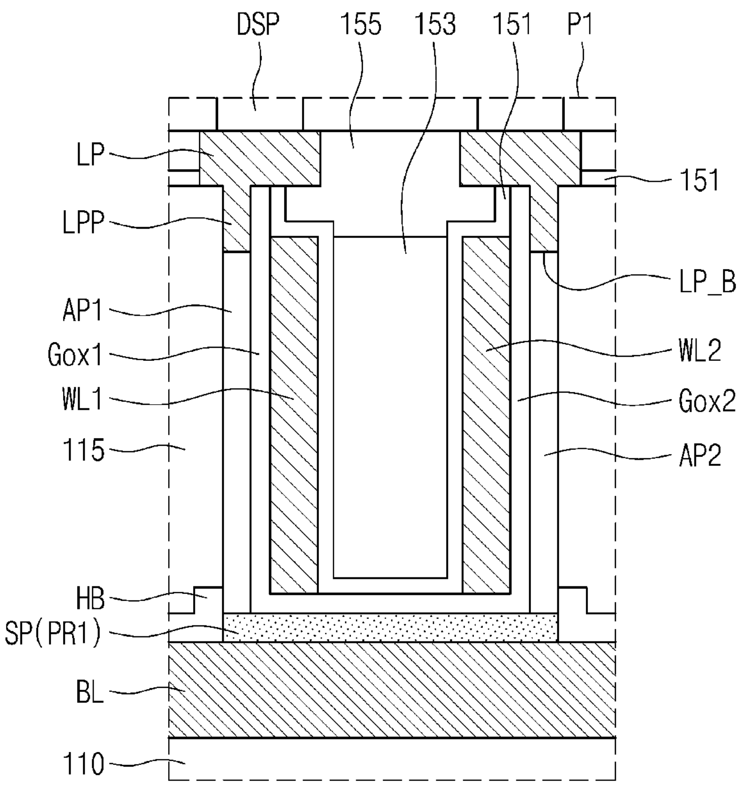
Figure 5C:
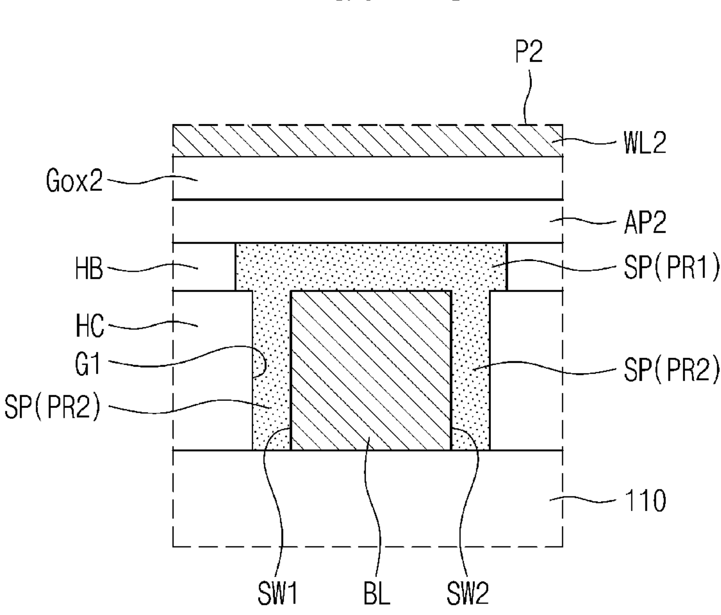
FIGS. 5C to 5E are enlarged views of a portion 'P2' of FIG. 4 according to some embodiments of the inventive concepts.
Figure 5D:
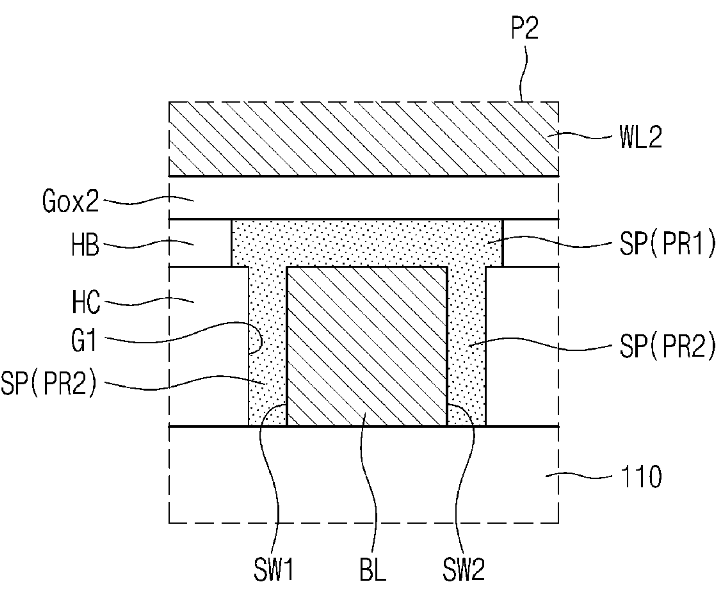
Figure 5E:
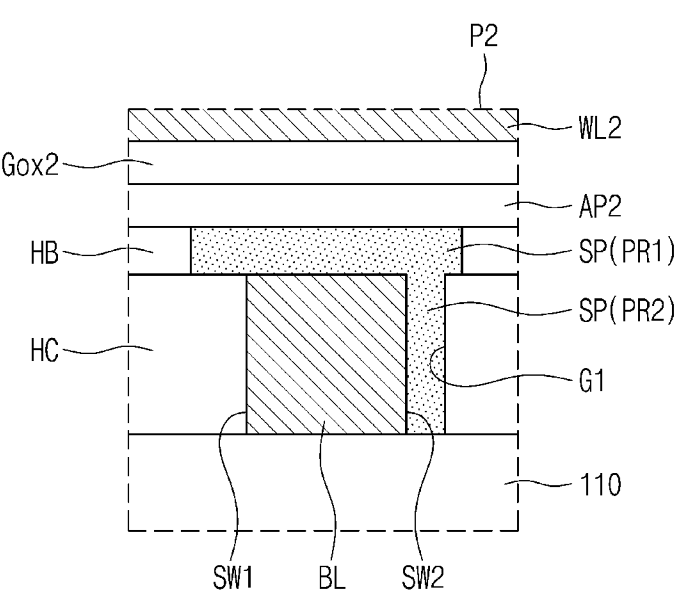
Figure 6A:
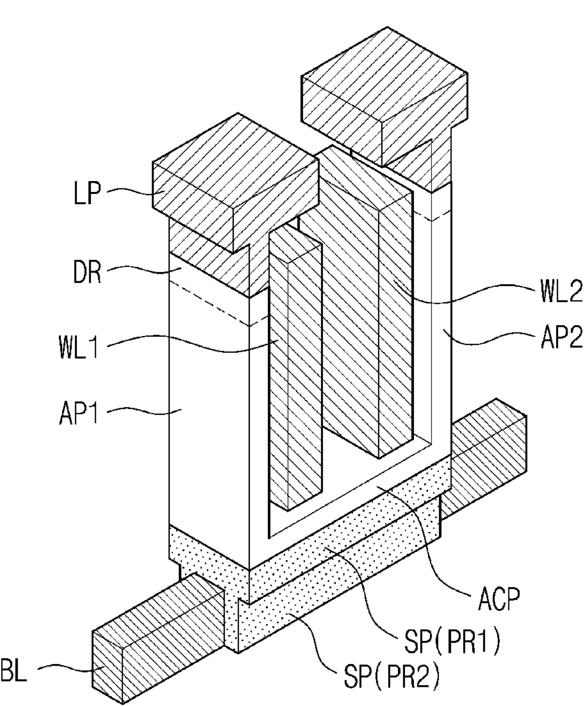
FIGS. 6A and 6B are perspective views illustrating semiconductor memory devices according to some embodiments of the inventive concepts.
Figure 6A:
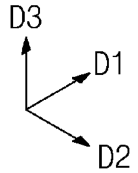
Figure 6B:
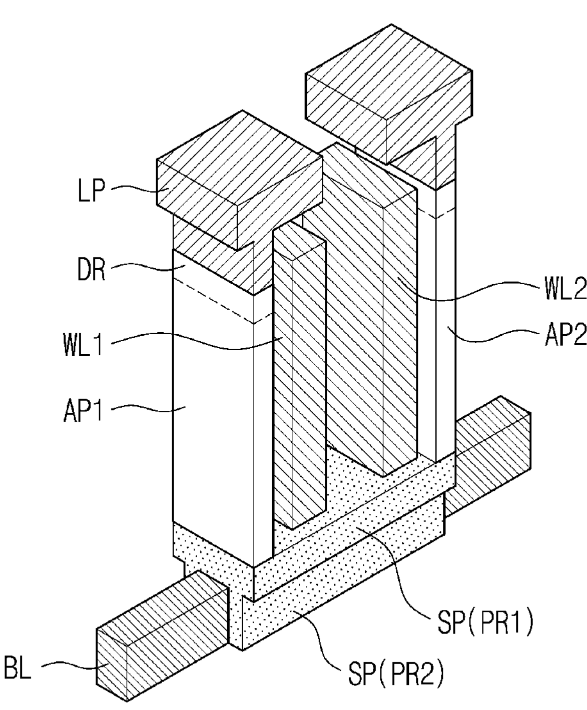
Figure 6B:
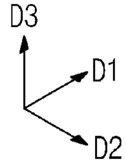

FIG. 3 is a plan view illustrating a semiconductor memory device according to some embodiments of the inventive concepts. FIG. 4 is a cross-sectional view taken along lines A-A', B-B' and C-C' of FIG. 3 to illustrate a semiconductor memory device according to some embodiments of the inventive concepts. FIGS. 5A and 5B are enlarged views of a portion 'P1' of FIG. 4 according to some embodiments of the inventive concepts. FIGS. 5C to 5E are enlarged views of a portion 'P2' of FIG. 4 according to some embodiments of the inventive concepts. FIGS. 6A and 6B are perspective views illustrating semiconductor memory devices according to some embodiments of the inventive concepts.

Referring to FIGS. 3 and 4, a lower insulating layer 110 may be disposed on a substrate 100. Bit lines BL may extend in the first direction D1 on the lower insulating layer 110 and may be spaced apart from each other in the second direction D2. The lower insulating layer 110 may cover the peripheral circuit structure PS.

For example, the bit lines BL may include doped polysilicon, a metal, a conductive metal nitride, a conductive metal silicide, a conductive metal oxide, or any combination thereof. The bit lines BL may be formed of, but not limited to, doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or any combination thereof. The bit lines BL may include a single layer or multi-layer of the materials described above. In some embodiments, the bit lines BL may include a two-dimensional or three-dimensional material and may include, for example, graphene corresponding to a carbon-based two-dimensional material, carbon nanotube corresponding to a three-dimensional material, or any combination thereof.

Referring to FIGS. 4 and 5C, a hydrogen supply insulating layer HC may be disposed between the bit lines BL. The hydrogen supply insulating layer HC may be referred to as 'an interlayer insulating layer'. For example, the hydrogen supply insulating layer HC may include or be formed of silicon oxide containing hydrogen, or SiOCH. For example, a concentration of hydrogen in the hydrogen supply insulating layer HC may range from 0.1 at % to 5 at %.

Referring to FIGS. 5C to 5E, source patterns SP may be disposed on the bit lines BL, respectively. Each of the bit lines BL may have a first side surface SW1 and a second side surface SW2, which are opposite to each other. A portion of the source pattern SP may extend downward so as to be disposed between the hydrogen supply insulating layer HC and the bit line BL. The portion of the source pattern SP may extend downward so as to be in contact with at least one of the first side surface SW1 or the second side surface SW2 of the bit line BL. As used herein, the term "in contact with" refers to direct contact (i.e., touching) unless the context indicates otherwise. The source pattern SP may have a first portion PR1 disposed on a top surface of the bit line BL, and one or two second portions PR2 being in contact with at least one of the first side surface SW1 or the second side surface SW2. For example, like FIG. 5E, the source pattern SP may have one second portion PR2 being in contact with the second side surface SW2. Alternatively, like FIGS. 5C and 5D, the source pattern SP may have two second portions PR2 being in contact with the first side surface SW1 and the second side surface SW2, respectively. The first portion PR1 and the second portion(s) PR2 of the source pattern SP may be connected to each other in one body without an interface therebetween.

Since the source pattern SP has the second portion(s) PR2 as well as the first portion PR1, a contact surface between the source pattern SP and the bit line BL may be increased, and thus a contact resistance between the bit line BL and the source pattern SP may be reduced.

Each of the source patterns SP may include or be formed of an oxide semiconductor, and for example, the oxide semiconductor may include or be formed of InxGayZnzO, InxGaySizO, InxSnyZnzO, InxZnyO, ZnxO, ZnxSnyO, ZnxOyN, ZrxZnySnzO, SnxO, HfxInyZnzO, GaxZnySnzO, AlxZnySnzO, YbxGayZnzO, InxGayO, or any combination thereof.

The hydrogen supply insulating layer HC may be in contact with the source pattern SP and may supply hydrogen into the source pattern SP. Thus, a concentration of hydrogen in the source pattern SP may be increased. The amount of charges may also be increased by the increase in the concentration of hydrogen in the source pattern SP, and the source pattern SP may be doped to have a first conductivity type. For example, the amount of electrons in the source pattern SP may be increased by the increase in the concentration of hydrogen, and the source pattern SP may be doped to have an N-type. Thus, an electrical resistance of the source pattern SP may be reduced.

A hydrogen diffusion barrier layer HB may be disposed on the hydrogen supply insulating layer HC. For example, the hydrogen diffusion barrier layer HB may have a single-layered or multi-layered structure of at least one of silicon nitride or aluminum oxide. The hydrogen diffusion barrier layer HB may prevent hydrogen included in the hydrogen supply insulating layer HC from being diffused into a structure on the hydrogen diffusion barrier layer HB. Therefore, hydrogen in the hydrogen supply insulating layer HC may not be diffused into channel patterns AP1 and AP2, and thus a concentration of hydrogen in the channel patterns AP1 and AP2 may be relatively very low. As a result, a short channel effect may be prevented, and reliability of the semiconductor memory device may be improved.

A mold insulating pattern 115 may be disposed on the hydrogen diffusion barrier layer HB. The mold insulating pattern 115 may define trenches which extend in the second direction D2 to intersect the bit lines BL and are spaced apart from each other in the first direction D1. For example, the mold insulating pattern 115 may include a silicon oxide layer, a silicon nitride layer, a silicon oxynitride layer, and/or a low-k dielectric layer.

A pair of first and second channel patterns AP1 and AP2 may be disposed in each of the trenches defined by the mold insulating pattern 115. In each of the trenches, the first channel patterns AP1 may be spaced apart from each other in the second direction D2, and the second channel patterns AP2 may be spaced apart from each other in the second direction D2. The first and second channel patterns AP1 and AP2 may be alternately arranged in the first direction D1 on each of the bit lines BL. In other words, the first and second channel patterns AP1 and AP2 may be two-dimensionally arranged in the first direction D1 and the second direction D2 which intersect each other.

Each of the first and second channel patterns AP1 and AP2 may include or be formed of an oxide semiconductor, and for example, the oxide semiconductor may include or be formed of InxGayZnzO, InxGaySizO, InxSnyZnzO, InxZnyO, ZnxO, ZnxSnyO, ZnxOyN, ZrxZnySnzO, SnxO, HfxInyZnzO, GaxZnySnzO, AlxZnySnzO, YbxGayZnzO, InxGayO, or any combination thereof. For example, each of the first and second channel patterns AP1 and AP2 may include or be formed of indium gallium zinc oxide (IGZO).

Each of the first and second channel patterns AP1 and AP2 may include a single layer or multi-layer of the oxide semiconductor. Each of the first and second channel patterns AP1 and AP2 may include or be formed of an amorphous, crystalline or polycrystalline oxide semiconductor. In some embodiments, each of the first and second channel patterns AP1 and AP2 may have a band gap energy greater than a band gap energy of silicon. For example, each of the first and second channel patterns AP1 and AP2 may have a band gap energy of about 1.5 eV to about 5.6 eV. For example, the first and second channel patterns AP1 and AP2 may have optimal channel performance when each having a band gap energy of about 2.0 eV to about 4.0 eV.

In certain embodiments, the first and second channel patterns AP1 and AP2 may include a two-dimensional or three-dimensional material and may include, for example, graphene corresponding to a carbon-based two-dimensional material, carbon nanotube corresponding to a three-dimensional material, or any combination thereof.

The first and second channel patterns AP1 and AP2 may penetrate the hydrogen diffusion barrier layer HB so as to be in contact with the first portion PR1 of the source pattern SP. The hydrogen diffusion barrier layer HB may be in contact with a side surface of the first portion PR1 of the source pattern SP and lower side surfaces of the first and second channel patterns AP1 and AP2.

Referring to FIGS. 5A and 6A, lower portions of the first and second channel patterns AP1 and AP2 may be connected to each other by a channel connecting portion ACP. The channel connecting portion ACP may be in contact with a top surface of the first portion PR1 of the source pattern SP. The first and second channel patterns AP1 and AP2 and the channel connecting portion ACP may be connected to each other in one body without an interface therebetween.

Alternatively, referring to FIGS. 5B and 6B, the first and second channel patterns AP1 and AP2 may not be connected to each other but may be spaced apart from each other.

A first word line WL1 and a second word line WL2 may be disposed between the pair of first and second channel patterns AP1 and AP2 adjacent to each other. The first word line WL1 and the second word line WL2 may extend in the second direction D2 and may be parallel to each other.

For example, the first and second word lines WL1 and WL2 may include doped polysilicon, a metal, a conductive metal nitride, a conductive metal silicide, a conductive metal oxide, or any combination thereof. The first and second word lines WL1 and WL2 may be formed of, but not limited to, doped polysilicon, Al, Cu, Ti, Ta, Ru, W, Mo, Pt, Ni, Co, TiN, TaN, WN, NON, TiAl, TiAlN, TiSi, TiSiN, TaSi, TaSiN, RuTiN, NiSi, CoSi, IrOx, RuOx, or any combination thereof. The first and second word lines WL1 and WL2 may include a single layer or multi-layer of the materials described above. In certain embodiments, the first and second word lines WL1 and WL2 may include a two-dimensional or three-dimensional material and may include, for example, graphene corresponding to a carbon-based two-dimensional material, carbon nanotube corresponding to a three-dimensional material, or any combination thereof.

Top surfaces of the first and second word lines WL1 and WL2 may be located at a higher level than top surfaces of the first and second channel patterns AP1 and AP2. In certain embodiments, the first and second word lines WL1 and WL2 may have spacer shapes. In other words, the first and second word lines WL1 and WL2 may have rounded top surfaces.

A first gate insulating pattern Gox1 may be disposed between the first channel pattern AP1 and the first word line WL1. A second gate insulating pattern Gox2 may be disposed between the second channel pattern AP2 and the second word line WL2. Like FIG. 5A, the first gate insulating pattern Gox1 and the second gate insulating pattern Gox2 may be connected to each other on the channel connecting portion ACP and may be in contact with the channel connecting portion ACP. Alternatively, like FIGS. 5B and 5D, the first gate insulating pattern Gox1 and the second gate insulating pattern Gox2 may be connected to each other on the source pattern SP and may be in contact with the source pattern SP.

The first and second gate insulating patterns Gox1 and Gox2 may be formed of a silicon oxide layer, a silicon oxynitride layer, a high-k dielectric layer having a dielectric constant higher than that of a silicon oxide layer, or any combination thereof. The high-k dielectric layer may be formed of a metal oxide or a metal oxynitride. For example, the high-k dielectric layer usable as a gate insulating layer may be formed of, but not limited to, HfO2, HfSiO, HfSiON, HfTaO, HfTiO, HfZrO, ZrO2, Al2O3, or any combination thereof.

A first capping pattern 151 and a second insulating pattern 153 may be disposed between a pair of the first and second word lines WL1 and WL2. The first capping pattern 151 may be disposed between the second insulating pattern 153 and outer side surfaces of the first and second word lines WL1 and WL2 and may cover upper side surfaces of the first and second channel patterns AP1 and AP2. The first capping pattern 151 may have a substantially uniform thickness and may be formed of an insulating material different from that of the second insulating pattern 153. The first capping pattern 151 and the second insulating pattern 153 may extend in the second direction D2. The first capping pattern 151 may cover a top surface of the mold insulating pattern 115.

A second capping pattern 155 may be provided on top surfaces of the first and second word lines WL1 and WL2. The second capping pattern 155 may cover the first capping pattern 151 and a top surface of the second insulating pattern 153. The second capping pattern 155 may extend in the second direction D2. The second capping pattern 155 may be formed of an insulating material different from that of the second insulating pattern 153.

Landing pads LP may be disposed in the second capping pattern 155. The landing pads LP may penetrate the first capping pattern 151. Portions of the landing pads LP may protrude downward so as to be in contact with the first and second channel patterns AP1 and AP2. In other words, the landing pads LP may have protruding portions LPP being in contact with the first and second channel patterns AP1 and AP2, respectively. The landing pads LP may be formed of, but not limited to, doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or any combination thereof.

Top surfaces WL_u of the first and second word lines WL1 and WL2 may be located at a first level LV1. Widths of the protruding portions LPP of the landing pads LP may be substantially equal to widths of the first and second channel patterns AP1 and AP2, respectively. Terms such as "same," "equal," "planar," "coplanar," "parallel," and "perpendicular," as used herein encompass identicality or near identicality including variations that may occur, for example, due to manufacturing processes. The term "substantially" may be used herein to emphasize this meaning, unless the context or other statements indicate otherwise. Bottom surfaces LP B of the protruding portions LPP of the landing pads LP may be located at a second level LV2. The second level LV2 may be lower than the first level LV1.

Referring to FIGS. 6A and 6B, the first word line WL1, the first channel pattern AP1 adjacent thereto and a portion of the source pattern SP thereunder may constitute one (e.g., referred to as 'a first transistor') of the selection elements (i.e., the transistors) TR described with reference to FIG. 2. An upper portion of the first channel pattern AP1 adjacent to the landing pad LP may function as a drain region DR of the first transistor in an operation of the first transistor. The second word line WL2, the second channel pattern AP2 adjacent thereto and another portion of the source pattern SP thereunder may constitute another (e.g., referred to as 'a second transistor') of the transistors TR described with reference to FIG. 2. An upper portion of the second channel pattern AP2 adjacent to the landing pad LP may function as a drain region DR of the second transistor in an operation of the second transistor.

Since the second level LV2 is lower than the first level LV1, when a voltage is applied to the first or second word line WL1 or WL2, controlling power of the first or second word line WL1 or WL2 on the landing pad LP may be increased, and electrons may be more collected in the landing pad LP. Thus, contact resistances between the landing pads LP and the first and second channel patterns AP1 and AP2 may be reduced.

In some embodiments, data storage patterns DSP may be disposed on the landing pads LP, respectively. The data storage patterns DSP may be electrically connected to the first and second channel patterns AP1 and AP2 through the landing pads LP, respectively. The data storage patterns DSP may be arranged in a matrix form in the first direction D1 and the second direction D2.

In some embodiments, each of the data storage patterns DSP may be a capacitor and may include lower and upper electrodes and a capacitor dielectric layer disposed therebetween. In this case, the lower electrode may be in contact with the landing pad LP, and the lower electrode may have one of various shapes such as a circular shape, an elliptical shape, a rectangular shape, a square shape, a diamond shape, and a hexagonal shape when viewed in a plan view.

Alternatively, each of the data storage patterns DSP may be a variable resistance pattern switchable between two resistance states by an electrical pulse applied thereto. For example, each of the data storage patterns DSP may include a phase-change material of which a crystal state is changeable depending on the amount of a current, a perovskite compound, a transition metal oxide, a magnetic material, a ferromagnetic material, an antiferromagnetic material, or any combination thereof.

Referring again to FIG. 3, the first and second word lines WL1 and WL2 adjacent to each other may be spaced apart from each other by a second insulating pattern 153 by a first distance S1. The first and second channel patterns AP1 and AP2 adjacent to each other may be spaced apart from each other by the mold insulating pattern 115 by a second distance S2. Here, the second distance S2 may be greater than the first distance S1. Thus, coupling noise between the first and second channel patterns AP1 and AP2 adjacent to each other may be reduced in operation of the vertical channel transistors. As a result, it is possible to prevent a leakage current from increasing in a selected transistor and an unselected transistor adjacent thereto in operation of the semiconductor memory device.

FIGS. 7A to 9A are plan views illustrating a method of manufacturing the semiconductor memory device of FIG. 3 according to example embodiments. FIGS. 7B to 9B are cross-sectional views taken along lines A-A', B-B' and C-C' of FIGS. 7A to 9A, respectively, to illustrate a method of manufacturing the semiconductor memory device of FIG. 4 according to example embodiments. FIGS. 10A to 10G are cross-sectional views illustrating a method of manufacturing the semiconductor memory device of FIG. 4 according to example embodiments.

Figure 7A:
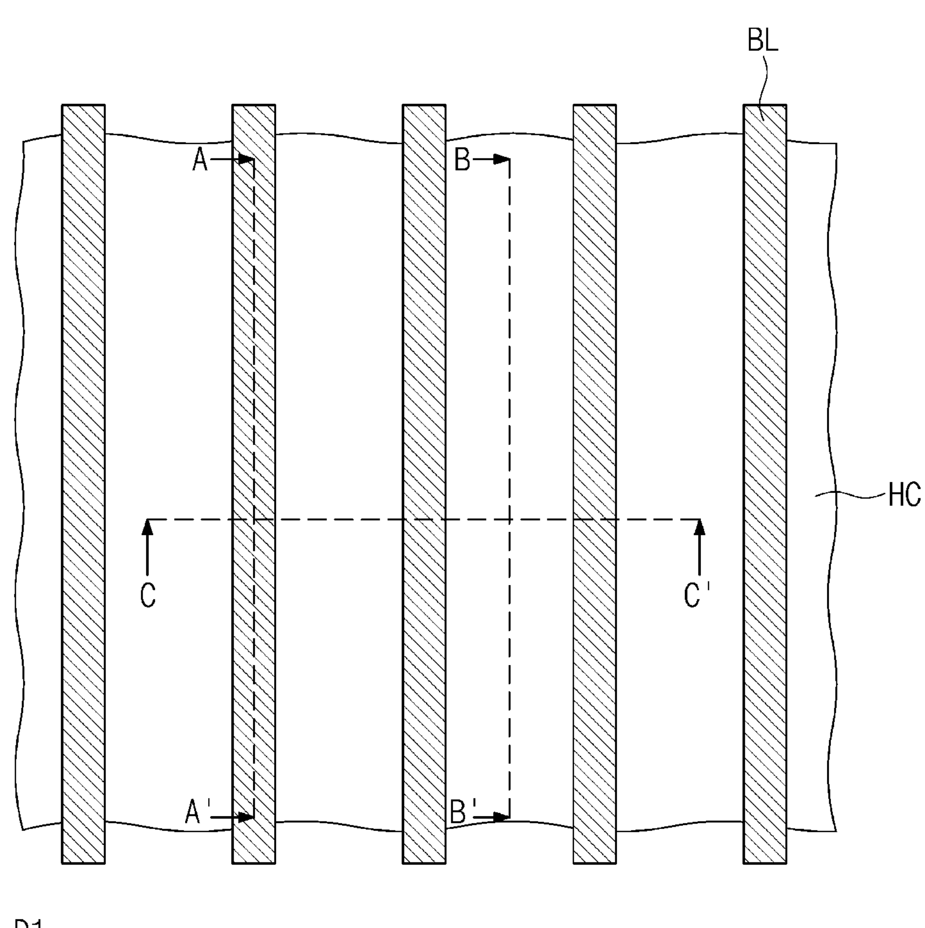
Figure 7A:
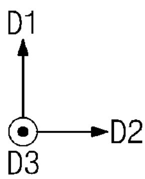
Figure 7B:
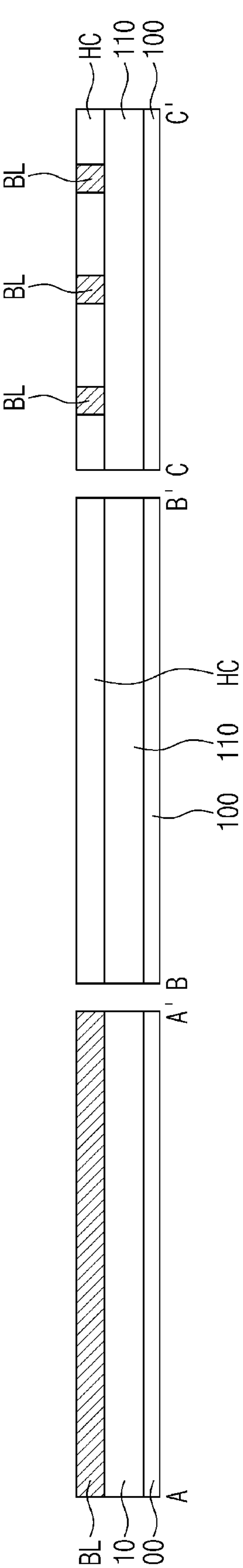

Referring to FIGS. 7A and 7B, a lower insulating layer 110 may be formed on a substrate 100. Bit lines BL may be formed on the lower insulating layer 110. The bit lines BL may extend in the first direction D1 and may be spaced apart from each other in the second direction D2. The lower insulating layer 110 may cover the substrate 100 and may include stacked insulating layers. For example, the lower insulating layer 110 may include a silicon oxide layer, a silicon nitride layer, a silicon oxynitride layer, and/or a low-k dielectric layer.

A conductive layer may be deposited on the lower insulating layer 110, and then, the conductive layer may be patterned to form the bit lines BL. A hydrogen supply insulating layer HC may be formed to fill a space between the bit lines BL, and a top surface of the hydrogen supply insulating layer HC may be substantially coplanar with top surfaces of the bit lines BL. Alternatively, trenches may be formed in the hydrogen supply insulating layer HC, and then, the bit lines BL may be formed by filling the trenches with a conductive material. For example, the hydrogen supply insulating layer HC may be formed of silicon oxide containing hydrogen, or SiOCH. For example, a concentration of hydrogen in the hydrogen supply insulating layer HC may range from 0.1 at % to 5 at %.

Figure 8A:
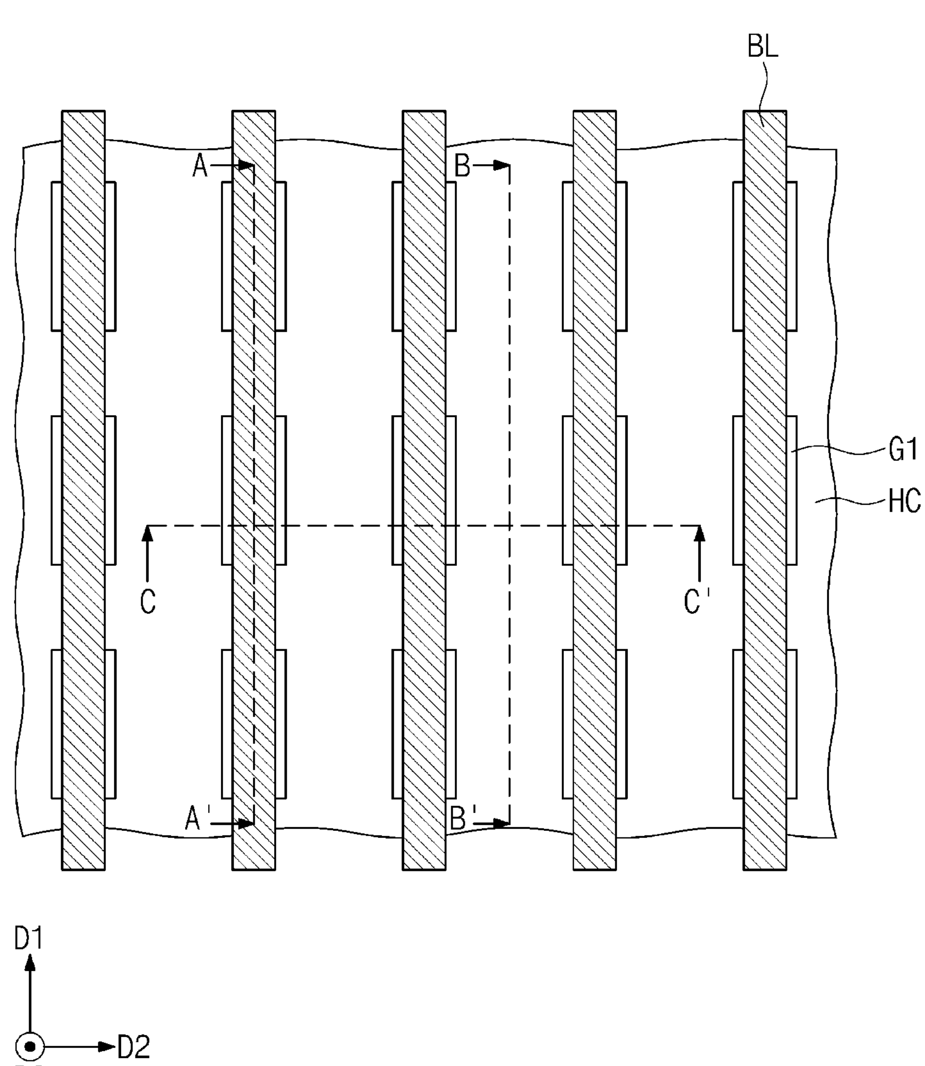
Figure 8B:
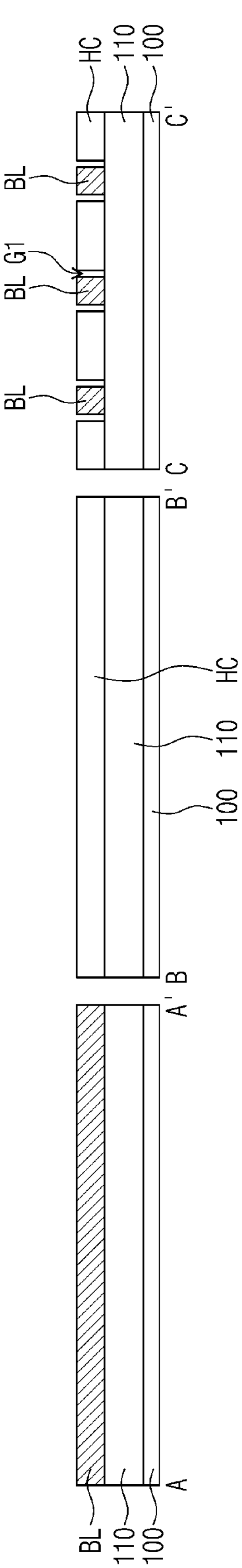

Referring to FIGS. 8A and 8B, the hydrogen supply insulating layer HC may be etched to form grooves G1 exposing side surfaces of the bit lines BL. The grooves G1 may be spaced apart from each other in the first and second directions D1 and D2.

Figure 9A:
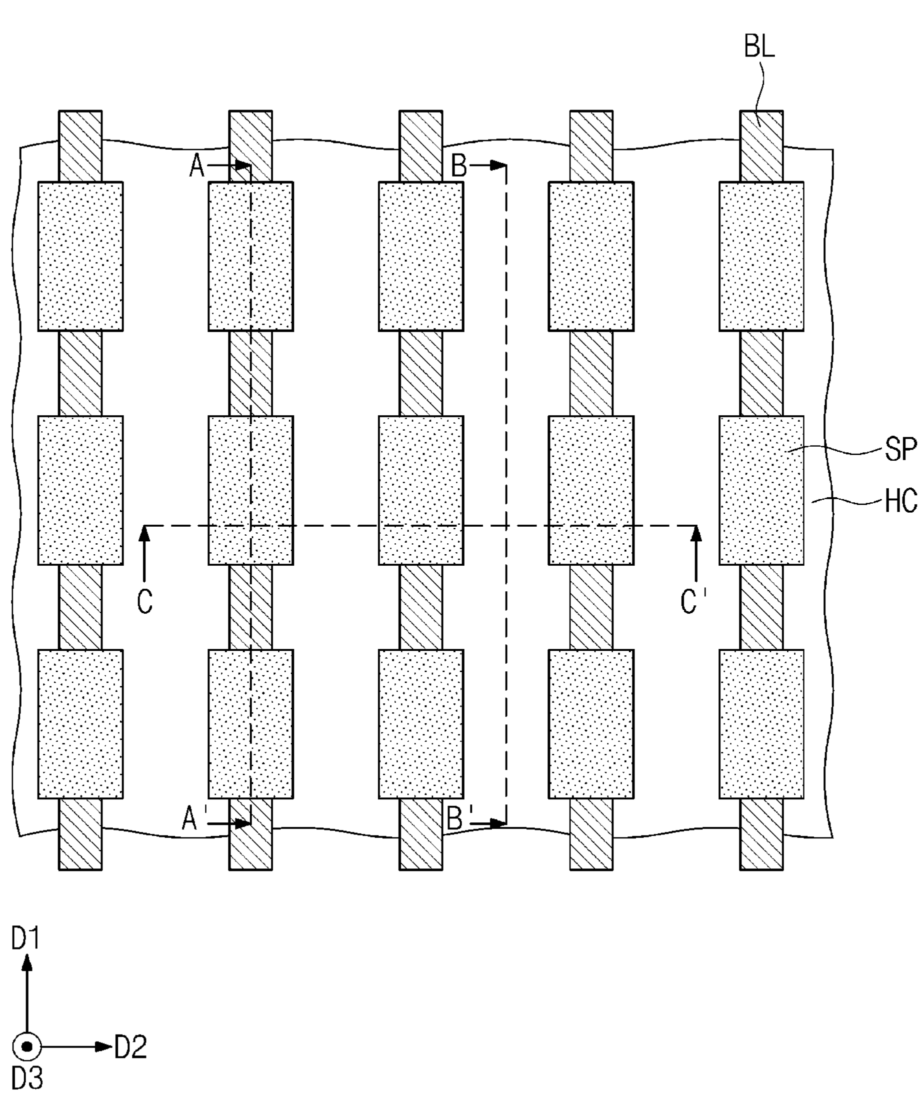
Figure 9B:
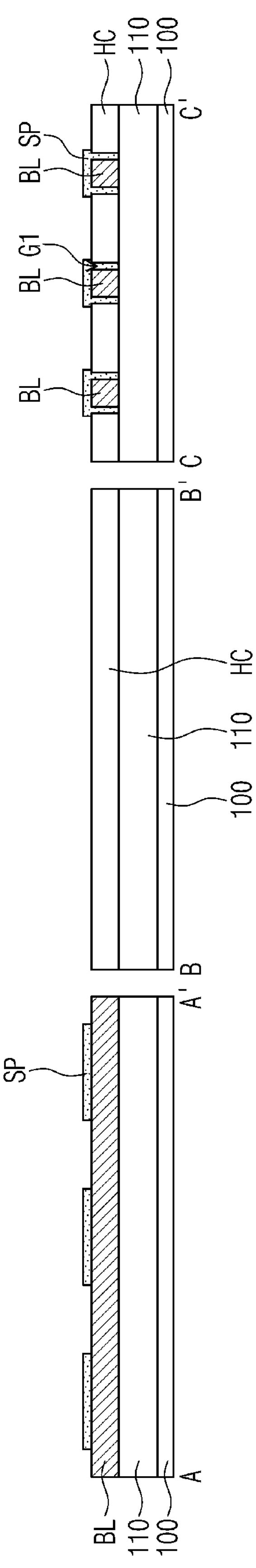

Referring to FIGS. 9A and 9B, a source layer may be formed on the hydrogen supply insulating layer HC and then may be patterned to form source patterns SP. At this time, the source patterns SP may fill the grooves G1, respectively. The source patterns SP may be spaced apart from each other in the first and second directions D1 and D2.

Figure 10A:
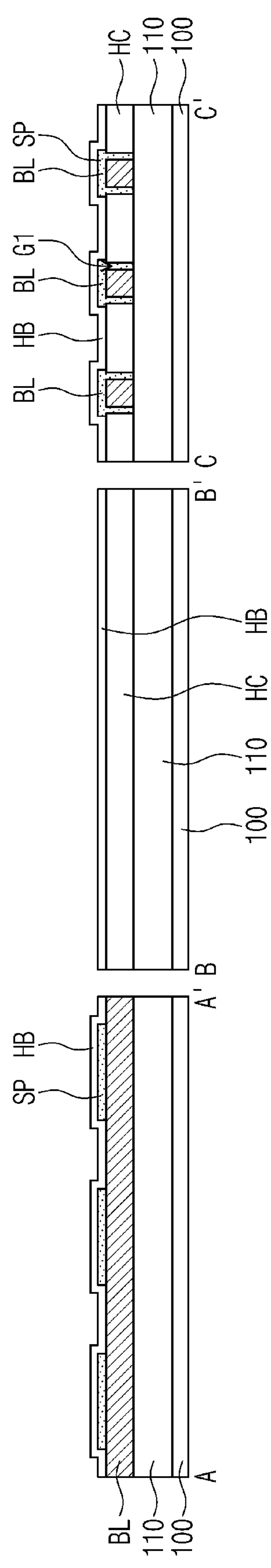
FIGS. 10A to 10G are cross-sectional views illustrating a method of manufacturing the semiconductor memory device of FIG. 4 according to example embodiments.

Referring to FIG. 10A, a hydrogen diffusion barrier layer HB may be conformally formed on an entire top surface of the substrate 100 having the source patterns SP. The hydrogen diffusion barrier layer HB may have a single-layered or multi-layered structure of at least one of silicon nitride and aluminum oxide.

Figure 10B:
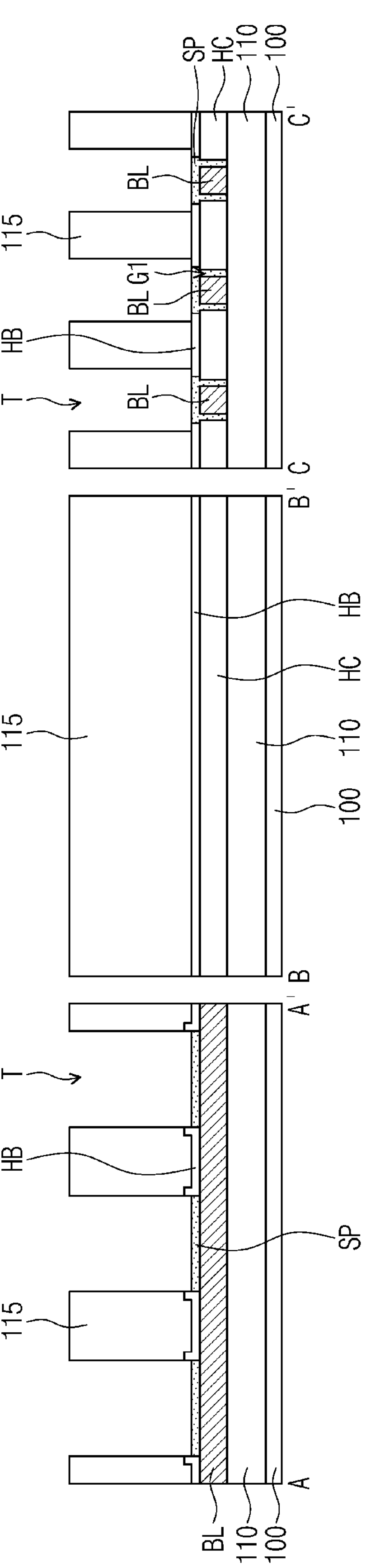

Referring to FIG. 10B, a mold insulating pattern 115 may be formed on the hydrogen diffusion barrier layer HB. The mold insulating pattern 115 may define trenches T spaced apart from each other. The trenches T may expose the hydrogen diffusion barrier layer HB. The hydrogen diffusion barrier layer HB exposed by the trenches T may be etched to expose the source patterns SP. The mold insulating pattern 115 may be formed of an insulating material having an etch selectivity with respect to the hydrogen diffusion barrier layer HB and the source patterns SP. For example, the mold insulating pattern 115 may be formed of a silicon oxide layer.

Figure 10C:
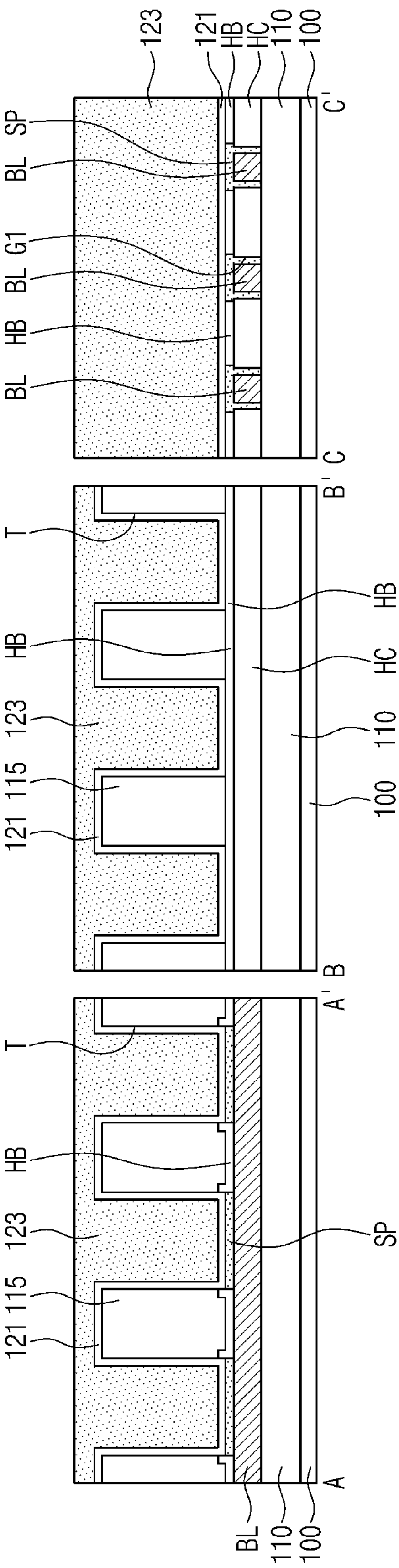

Referring to FIG. 10C, the mold insulating pattern 115 in the cross-section taken along the line C-C' may be removed. In addition, the mold insulating pattern 115 in the cross-section taken along the line B-B' may be etched to additionally form trenches. An active layer 121 may be formed to conformally cover the mold insulating pattern 115 having the trenches. The active layer 121 may be in contact with the source patterns SP in the trenches and may cover a top surface and side surfaces of the mold insulating pattern 115.

The active layer 121 may be formed using at least one of a physical vapor deposition (PVD) technique, a thermal chemical vapor deposition (thermal CVD) technique, a low-pressure chemical vapor deposition (LP-CVD) technique, a plasma-enhanced chemical vapor deposition (PE-CVD) technique, and an atomic layer deposition (ALD) technique. The active layer 121 may cover bottom surfaces and inner side surfaces of the trenches T with a substantially uniform thickness. A thickness of the active layer 121 may be less than a half of a width of the trench. For example, the active layer 121 may be deposited with a thickness of several to several tens nm (e.g., a thickness of 1 nm to 30 nm, in particular, a thickness of 1 nm to 10 nm). The active layer 121 may include a semiconductor material, an oxide semiconductor material, or a two-dimensional semiconductor material. For example, the active layer 121 may include or be formed of silicon, germanium, silicon-germanium, or indium gallium zinc oxide (IGZO).

A sacrificial layer 123 filling the trenches may be formed on the active layer 121. The sacrificial layer 123 may have a substantially flat top surface. The sacrificial layer 123 may be formed of an insulating material having an etch selectivity with respect to the mold insulating pattern 115. For example, the sacrificial layer 123 may be formed of one of an insulating material and silicon oxide, which are formed using a spin-on-glass (SOG) technique.

Subsequently, the sacrificial layer 123 and the active layer 121 may be planarized to expose a top surface of the mold insulating pattern 115.

Figure 10D:
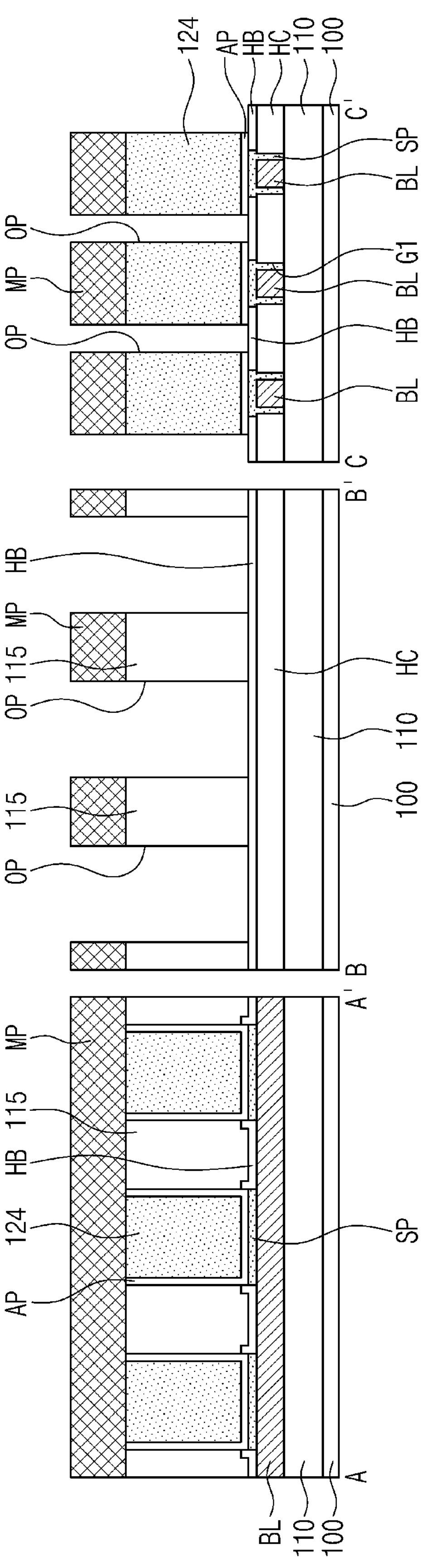

Next, referring to FIG. 10D, after the planarization process of the sacrificial layer 123 and the active layer 121, a mask pattern MP may be formed on the planarized sacrificial layer 123 and the planarized active layer 121.

The mask pattern MP may have openings having longitudinal axes parallel to the first direction D1 on the mold insulating pattern 115. The openings of the mask pattern MP may be spaced apart from each other in the second direction D2. The openings of the mask pattern MP may be located between the bit lines BL when viewed in a plan view. The mask pattern MP may expose portions of a top surface of the active layer 121.

Subsequently, the sacrificial layer 123 and the active layer 121 may be sequentially etched using the mask pattern MP as an etch mask to form openings OP exposing the hydrogen diffusion barrier layer HB between the bit lines BL.

Thus, preliminary channel patterns AP and sacrificial patterns 124 on the preliminary channel patterns AP may be formed in each of the trenches. In each of the trenches, the preliminary channel patterns AP may be spaced apart from each other in the second direction D2, and the sacrificial patterns 124 may be spaced apart from each other in the second direction D2.

Each of the preliminary channel patterns AP may include a horizontal portion being in contact with the source pattern SP, and a pair of vertical portions extending from the horizontal portion and being in contact with the side surfaces of each of the trenches.

After the formation of the preliminary channel patterns AP, an ashing process may be performed to remove the mask pattern MP.

Figure 10E:
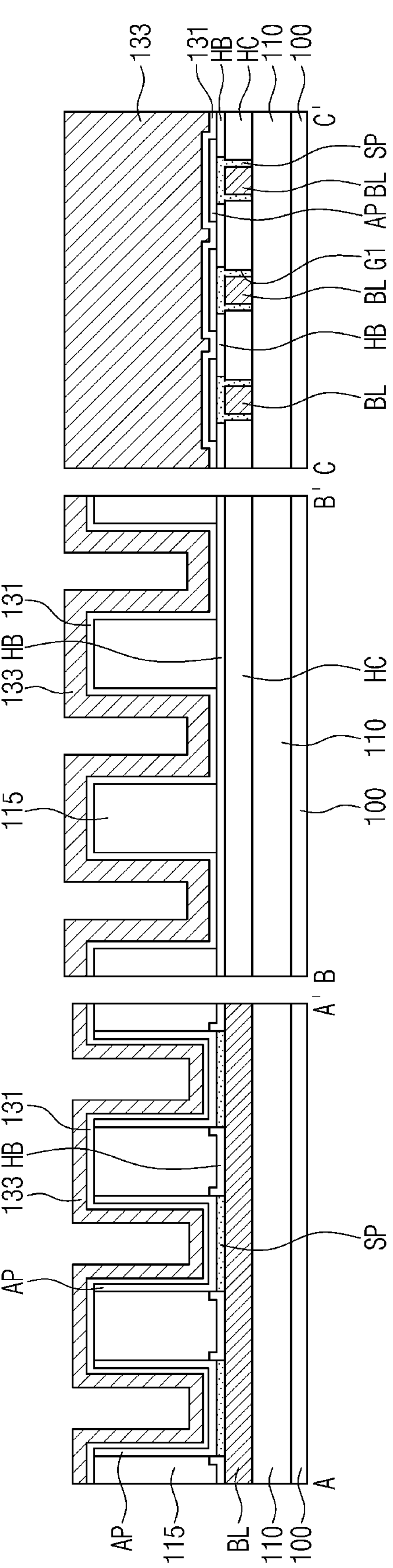

Next, referring to FIG. 10E, the sacrificial patterns 124 may be removed using an etch recipe having an etch selectivity with respect to the mold insulating pattern 115 and the preliminary channel patterns AP. Thus, surfaces of the preliminary channel patterns AP spaced apart from each other in the second direction D2 may be exposed in each of the trenches.

Subsequently, a gate insulating layer 131 and a gate conductive layer 133 may be sequentially deposited to conformally cover the preliminary channel patterns AP. The gate insulating layer 131 and the gate conductive layer 133 may be formed using at least one of a physical vapor deposition (PVD) technique, a thermal chemical vapor deposition (thermal CVD) technique, a low-pressure chemical vapor deposition (LP-CVD) technique, a plasma-enhanced chemical vapor deposition (PE-CVD) technique, and an atomic layer deposition (ALD) technique.

The gate insulating layer 131 and the gate conductive layer 133 may cover the horizontal portions and the vertical portions of the preliminary channel patterns AP with substantially uniform thicknesses. A sum of the thicknesses of the gate insulating layer 131 and the gate conductive layer 133 may be less than a half of the width of the trench. Thus, the gate conductive layer 133 may be deposited on the gate insulating layer 131 while defining a gap region in the trench.

The gate insulating layer 131 may be in contact with the hydrogen diffusion barrier layer HB and side surfaces of the mold insulating pattern 115 between the preliminary channel patterns AP.

Figure 10F:
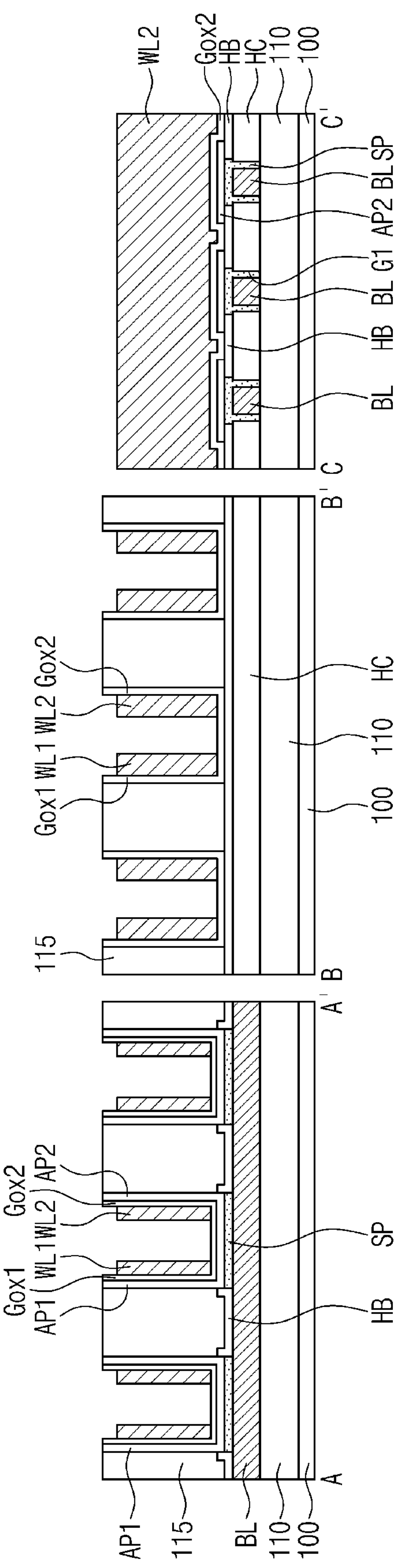

Referring to FIG. 10F, an anisotropic etching process may be performed on the gate conductive layer 133 to form a pair of first and second word lines WL1 and WL2 separated from each other in each of the trenches. When the anisotropic etching process is performed on the gate conductive layer 133, top surfaces of the first and second word lines WL1 and WL2 may be lower than the top surfaces of the preliminary channel patterns AP. Alternatively, an etching process of recessing the top surfaces of the first and second word lines WL1 and WL2 may be additionally performed. Portions of the preliminary channel pattern AP that are adjacent to the first and second word lines WL1 and WL2 may be called first and second channel patterns AP1 and AP2, respectively. Furthermore, portions of the gate insulating layer 131 that are adjacent to the first and second word lines WL1 and WL2 may be called first and second gate insulating patterns Gox1 and Gox2, respectively.

Next, anisotropic etching processes may be sequentially performed on the gate insulating layer 131 and the preliminary channel patterns AP exposed by the first and second word lines WL1 and WL2. Thus, a pair of first and second channel patterns AP1 and AP2 separated from each other and a pair of first and second gate insulating patterns Gox1 and Gox2 separated from each other may be formed in each of the trenches.

Figure 10G:
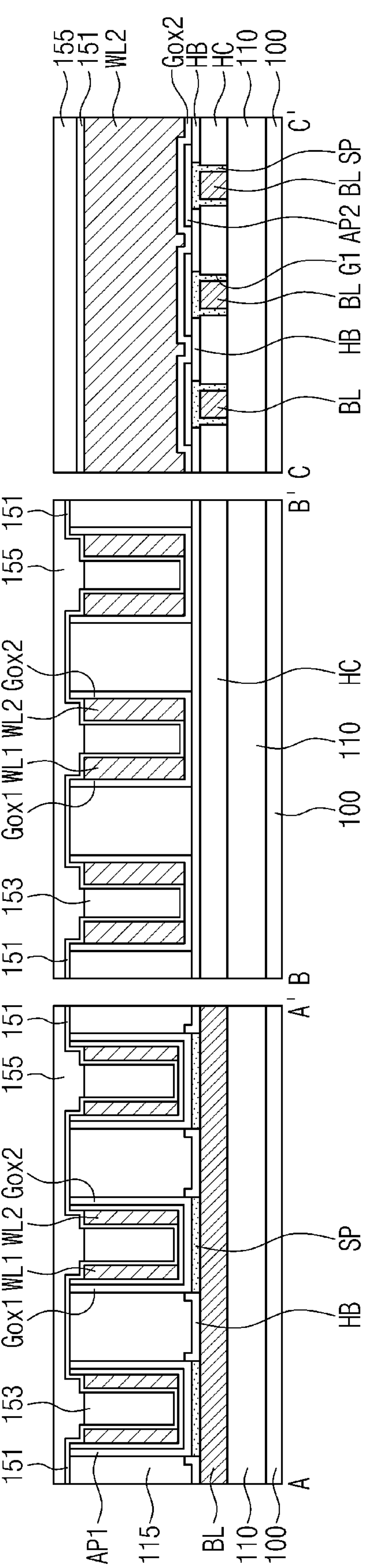

Referring to FIG. 10G, after the formation of the first and second word lines WL1 and WL2, a first capping pattern 151 may be conformally stacked as described with reference to FIG. 4. An insulating layer may be deposited to fill a space between the first and second word lines WL1 and WL2 and then may be recessed to form a second insulating pattern 153. A second capping pattern 155 may be formed on the second insulating pattern 153 and the first capping pattern 151.

Referring again to FIG. 4, landing pads LP and data storage patterns DSP may be formed.

According to the embodiments of the inventive concepts, the source pattern may be in contact with the side surfaces of the bit line to reduce the contact resistance between the source pattern and the bit line.

The hydrogen supply insulating layer may be in contact with the source pattern and may supply hydrogen into the source pattern. Thus, the electrical resistance of the source pattern may be reduced.

The hydrogen diffusion barrier layer may be disposed on the hydrogen supply insulating layer to prevent hydrogen from being diffused into the channel pattern. Thus, a short channel effect may be prevented, and reliability of the semiconductor memory device may be improved. As a result, electrical characteristics of the semiconductor memory device may be improved. In addition, the semiconductor memory device may have the vertical channel, and thus the integration density of the semiconductor memory device may be improved.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor memory device comprising:
- bit lines disposed on a substrate and extending in a first direction in parallel to each other;
- a hydrogen supply insulating layer including hydrogen and filling a space between the bit lines;
- a source pattern located on each of the bit lines and being in partial contact with the hydrogen supply insulating layer;
- a hydrogen diffusion barrier layer covering a top surface of the hydrogen supply insulating layer and being in contact with a side surface of the source pattern,
- a first channel pattern located on the source pattern,
- a first word line being adjacent to a side surface of the first channel pattern and crossing over the bit lines; and
- a landing pad on the first channel pattern,
- wherein a portion of the source pattern extends between a first side surface of a corresponding one of the bit lines and the hydrogen supply insulating layer and is in contact with the first side surface.

2. The semiconductor memory device of claim 1, wherein a concentration of hydrogen in the hydrogen supply insulating layer ranges from 0.1 at % to 5 at %.

3. The semiconductor memory device of claim 1, wherein the hydrogen diffusion barrier layer has a single-layered or multi-layered structure of at least one of silicon nitride and aluminum oxide.

4. The semiconductor memory device of claim 1, wherein the corresponding one of the bit lines has a second side surface opposite to the first side surface, and
- wherein another portion of the source pattern extends between the second side surface of the corresponding one of the bit lines and the hydrogen supply insulating layer and is in contact with the second side surface.

5. The semiconductor memory device of claim 1, wherein a top surface of the first word line is located at a first level,
- wherein the landing pad includes a protruding portion which extends toward the first channel pattern in a vertical direction and has the same width as the first channel pattern in the first direction, and
- wherein a bottom surface of the protruding portion is located at a second level lower than the first level.

6. The semiconductor memory device of claim 1, wherein the first channel pattern penetrates the hydrogen diffusion barrier layer so as to be in contact with the source pattern.

7. The semiconductor memory device of claim 1, further comprising:

a second channel pattern which is located on the source pattern and is adjacent to the first channel pattern; and a second word line which is located between the first word line and the second channel pattern and is closer to the second channel pattern than the first word line in the first direction.

8. The semiconductor memory device of claim 7, further comprising:

a channel connecting portion which connects lower portions of the first channel pattern and the second channel pattern and is in contact with the source pattern.

9. The semiconductor memory device of claim 1, wherein a concentration of hydrogen in the source pattern is higher than a concentration of hydrogen in the first channel pattern.

10. A semiconductor memory device comprising:

bit lines disposed on a substrate and extending in a first direction in parallel to each other;

a hydrogen supply insulating layer including hydrogen and filling a space between the bit lines;

a source pattern located on each of the bit lines and being in partial contact with the hydrogen supply insulating layer;

a hydrogen diffusion barrier layer covering a top surface of the hydrogen supply insulating layer and being in contact with a side surface of the source pattern;

a first channel pattern located on the source pattern;

a first word line being adjacent to a side surface of the first channel pattern and crossing over the bit lines; and a landing pad on the first channel pattern, wherein a top surface of the first word line is located at a first level, wherein the landing pad includes a protruding portion which extends toward the first channel pattern in a vertical direction and has the same width as the first channel pattern in the first direction, and wherein a bottom surface of the protruding portion is located at a second level lower than the first level.

11. The semiconductor memory device of claim 10, wherein the hydrogen diffusion barrier layer has a single-layered or multi-layered structure of at least one of silicon nitride and aluminum oxide.

12. The semiconductor memory device of claim 10, wherein the first channel pattern penetrates the hydrogen diffusion barrier layer so as to be in contact with the source pattern.

13. The semiconductor memory device of claim 10, wherein a concentration of hydrogen in the source pattern is higher than a concentration of hydrogen in the first channel pattern.

14. A semiconductor memory device comprising:

bit lines disposed on a substrate and extending in a first direction in parallel to each other;

a hydrogen supply insulating layer including hydrogen and filling a space between the bit lines;

a source pattern located on each of the bit lines and being in partial contact with the hydrogen supply insulating layer;

a hydrogen diffusion barrier layer covering a top surface of the hydrogen supply insulating layer and being in contact with a side surface of the source pattern;

a first channel pattern located on the source pattern;

a first word line being adjacent to a side surface of the first channel pattern and crossing over the bit lines;

a landing pad on the first channel pattern;

a second channel pattern which is located on the source pattern and is adjacent to the first channel pattern; and a second word line which is located between the first word line and the second channel pattern and is closer to the second channel pattern than the first word line in the first direction.

15. The semiconductor memory device of claim 14, wherein the hydrogen diffusion barrier layer has a single-layered or multi-layered structure of at least one of silicon nitride and aluminum oxide.

16. The semiconductor memory device of claim 14, wherein the first channel pattern penetrates the hydrogen diffusion barrier layer so as to be in contact with the source pattern.

17. The semiconductor memory device of claim 14, further comprising:

a channel connecting portion which connects lower portions of the first channel pattern and the second channel pattern and is in contact with the source pattern.

18. The semiconductor memory device of claim 14, wherein a concentration of hydrogen in the source pattern is higher than a concentration of hydrogen in the first channel pattern.

* * * * *